(12) United States Patent
Nakamura et al.

(10) Patent No.: US 11,160,164 B2
(45) Date of Patent: Oct. 26, 2021

(54) WIRING SUBSTRATE

(71) Applicant: IBIDEN CO., LTD., Ogaki (JP)

(72) Inventors: Takenobu Nakamura, Ogaki (JP);
Takahiro Yamazaki, Ogaki (JP);
Takashi Yamauchi, Ogaki (JP);
Toshihide Makino, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/831,902

(22) Filed: Mar. 27, 2020

(65) Prior Publication Data

US 2020/0315002 A1    Oct. 1, 2020

(30) Foreign Application Priority Data

Mar. 27, 2019    (JP) .............................. JP2019-061840

(51) Int. Cl.
*H05K 1/02*    (2006.01)
*H05K 1/11*    (2006.01)
*H05K 1/03*    (2006.01)

(52) U.S. Cl.
CPC ........... *H05K 1/0271* (2013.01); *H05K 1/112* (2013.01); *H05K 1/0366* (2013.01); *H05K 2201/096* (2013.01); *H05K 2201/09563* (2013.01); *H05K 2201/09827* (2013.01)

(58) Field of Classification Search
CPC ................. H05K 1/0271; H05K 1/112; H05K 2201/096; H05K 2201/09563; H05K 2201/09827
See application file for complete search history.

(56) References Cited

U.S. PATENT DOCUMENTS

| 8,242,379 B2 | 8/2012 | Ikeda et al. | |
| 9,326,377 B2* | 4/2016 | Morita | H05K 1/0306 |
| 2007/0193679 A1* | 8/2007 | Iwata | H05K 3/4682 |
| | | | 156/247 |
| 2009/0205202 A1* | 8/2009 | Tanaka | H05K 1/185 |
| | | | 29/834 |

(Continued)

FOREIGN PATENT DOCUMENTS

WO    WO 2008/053833 A1    5/2008

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes a core layer, first conductor layers including first inner, outer and intermediate conductor layers, second conductor layers including second inner, outer and intermediate conductor layers, interlayer insulating layers interposed between the first conductor layers and between the second conductor layers, and via conductors formed in the core layer such that each via conductor decreases in diameter from one of the inner conductor layers toward the other one of the inner conductor layers and that the other one of the inner conductor layers has thickness greater than thickness of the one of the inner conductor layers. The first and/or second inner conductor layers includes a first laminated structure including metal foil and plating film layers, the first and/or second outer conductor layers includes the first laminated structure, and the first and/or second intermediate conductor layers includes a second laminated structure including metal foil and plating film layers.

20 Claims, 7 Drawing Sheets

(56) References Cited

U.S. PATENT DOCUMENTS

| | | | |
|---|---|---|---|
| 2010/0218980 A1* | 9/2010 | Furuta | H05K 1/111 174/257 |
| 2015/0000959 A1* | 1/2015 | Su | H05K 3/4623 174/251 |
| 2015/0257268 A1* | 9/2015 | Kitagawa | H05K 3/007 174/262 |
| 2017/0170130 A1* | 6/2017 | Kaneda | H01L 23/3114 |
| 2018/0042124 A1* | 2/2018 | Makino | H05K 3/4652 |

* cited by examiner

WIRING SUBSTRATE

CROSS-REFERENCE TO RELATED APPLICATIONS

The present application is based upon and claims the benefit of priority to Japanese Patent Application No. 2019-061840, filed Mar. 27, 2019, the entire contents of which are incorporated herein by reference.

BACKGROUND OF THE INVENTION

Field of the Invention

The present invention relates to a wiring substrate.

Description of Background Art

International Publication No. 2008/053833 describes a multilayer printed wiring board having a core substrate formed of a double-sided copper-clad laminated plate. Surface-layer conductor circuits are connected to each other by via holes that are formed by electrolytic copper plating and penetrate an insulating layer of the double-sided copper-clad laminated plate. The entire contents of this publication are incorporated herein by reference.

SUMMARY OF THE INVENTION

According to one aspect of the present invention, a wiring substrate includes a core layer, first conductor layers formed on a first surface of the core layer and including a first inner conductor layer formed on the first surface of the core layer, a first outer conductor layer forming an outermost conductor layer on a first surface side of the core layer, and a first intermediate conductor layer formed between the first inner conductor layer and the first outer conductor layer, second conductor layers formed on a second surface of the core layer on the opposite side with respect to the first surface of the core layer and including a second inner conductor layer formed on the second surface of the core layer, a second outer conductor layer forming an outermost conductor layer on a second surface side of the core layer, and a second intermediate conductor layer formed between the second inner conductor layer and the second outer conductor layer, interlayer insulating layers interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer, and via conductors formed in the core layer such that each of the via conductors decreases in diameter from one of the first inner conductor layer and the second inner conductor layer toward the other one of the first inner conductor layer and the second inner conductor layer and connects the first inner conductor layer and the second inner conductor layer and that the other one of the first inner conductor layer and the second inner conductor layer is formed to have a thickness that is greater than a thickness of the one of the first inner conductor layer and the second inner conductor layer. At least one of the first and second inner conductor layers includes a first laminated structure including a metal foil layer and a plating film layer, at least one of the first and second outer conductor layers includes the first laminated structure, and at least one of the first and second intermediate conductor layers includes a second laminated structure including a metal foil layer and a plating film layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
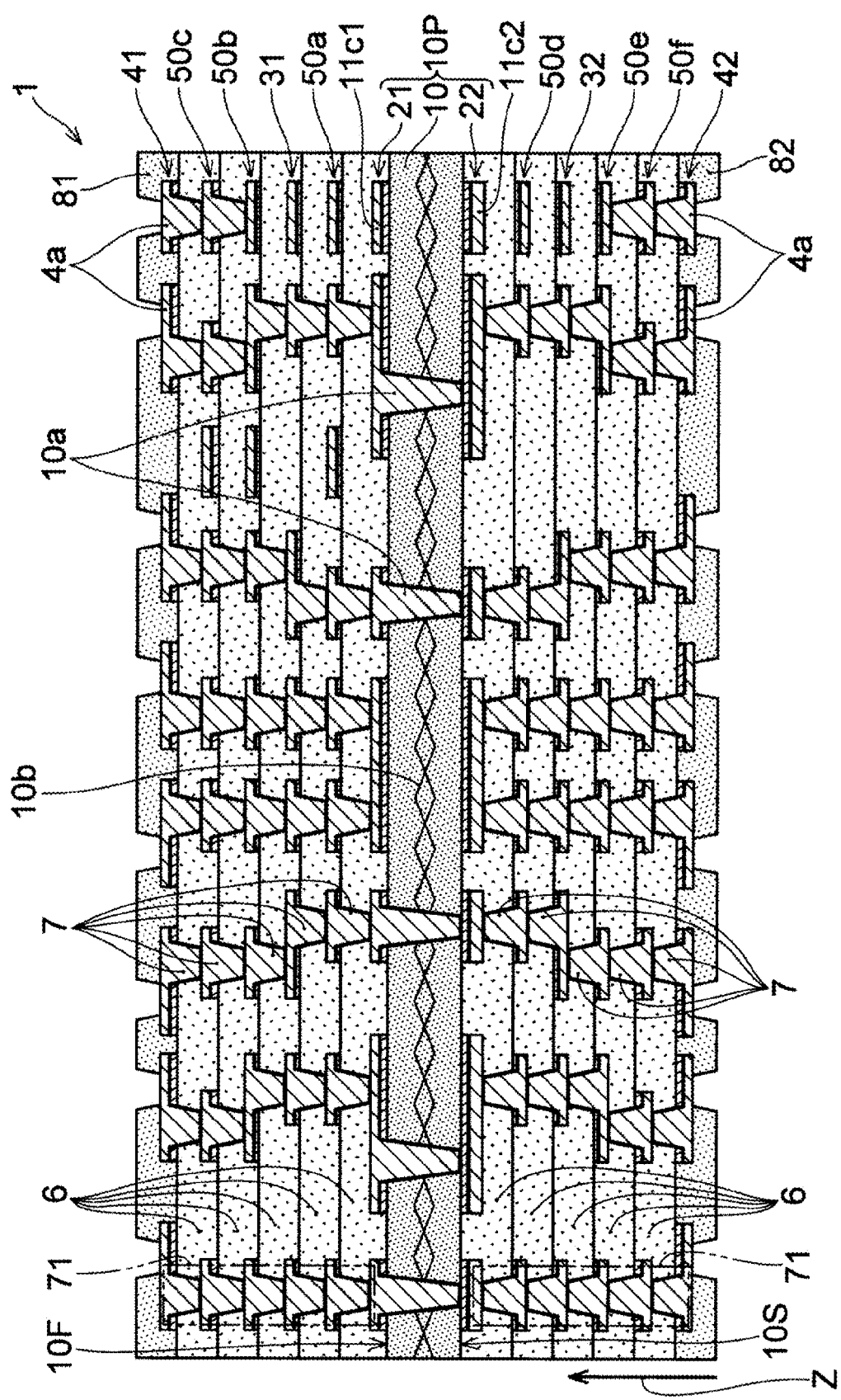
FIG. 1 is a cross-sectional view illustrating an example of a wiring substrate of an embodiment of the present invention.

Embodiments will now be described with reference to the accompanying drawings, wherein like reference numerals designate corresponding or identical elements throughout the various drawings.

Next, a wiring substrate according to an embodiment of the present invention is described with reference to the drawings. FIG. 1 illustrates a cross-sectional view of a wiring substrate 1 which is an example of the wiring substrate of the embodiment. As illustrated in FIG. 1, the wiring substrate 1 includes a core layer 10 having a first surface (10F) and a second surface (10S) on an opposite side with respect to the first surface (10F), a first inner conductor layer 21 formed on the first surface (10F) of the core layer 10, and a second inner conductor layer 22 formed on the second surface (10S) of the core layer 10. The core layer 10 is formed using an insulating material. The core layer 10 and the first and second inner conductor layers (21, 22) form a core substrate (10P). Multiple conductor layers and multiple interlayer insulating layers are formed on each of a first surface (10F) side and a second surface (10S) side of the core substrate (10P). That is, the wiring substrate 1 further includes a first outer conductor layer 41 formed on an outermost layer on the first surface (10F) side of the core layer 10, a second outer conductor layer 42 formed on an outermost layer on the second surface (10S) side of the core layer 10, a first intermediate conductor layer 31 formed between the first inner conductor layer 21 and the first outer conductor layer 41, and a second intermediate conductor layer 32 formed between the second inner conductor layer 22 and the second outer conductor layer 42. Further, the wiring substrate 1 includes interlayer insulating layers 6 respectively interposed between the first inner conductor layer 21 and the first intermediate conductor layer 31, between the second inner conductor layer 22 and the second intermediate conductor layer 32, between the first intermediate conductor layer 31 and the first outer conductor layer 41, and, between the second intermediate conductor layer 32 and the second outer conductor layer 42.

The wiring substrate 1 of the embodiment illustrated in FIG. 1 further includes three conductor layers on each of the first surface (10F) side and the second surface (10S) side of the core layer 10. That is, the wiring substrate 1 in the example of FIG. 1 includes an inner-layer conductor layer (50a) between the first inner conductor layer 21 and the first intermediate conductor layer 31, and includes two inner-layer conductor layers (50b, 50c) between the first intermediate conductor layer 31 and the first outer conductor layer 41. Further, the wiring substrate 1 includes an inner-layer conductor layer (50d) between the second inner conductor layer 22 and the second intermediate conductor layer 32, and includes two inner-layer conductor layers (50e, 50f) between the second intermediate conductor layer 32 and the second outer conductor layer 42. The interlayer insulating layers 6 are respectively provided between the inner-layer conductor layers (50a-50f) and the conductor layers that are respectively adjacent to the inner-layer conductor layers. A build-up layer on the first surface (10F) side is formed by the inner-layer conductor layers (50a-50c), the first intermediate conductor layer 31, the first outer conductor layer 41, and the interlayer insulating layers 6 formed on the first surface (10F) side of the core layer 10. Similarly, a build-up layer on the second surface (10S) side is formed by the inner-layer conductor layers (50d-50f), the second intermediate conductor layer 32, the second outer conductor layer 42, and the interlayer insulating layers 6 formed on the second surface (10S) side of the core layer 10.

The wiring substrate 1 illustrated in FIG. 1 include 12 conductor layers in total. However, the number of the conductor layers of the wiring substrate of the present embodiment is not limited to 12. The wiring substrate 1 can include an arbitrary number of three or more of conductor layers on each of the first surface (10F) side and the second surface (10S) side of the core layer 10. For example, the wiring substrate 1 can include an arbitrary number of 1 or more of inner-layer conductor layers such as the inner-layer conductor layers (50a-50f) between the first inner conductor layer 21 and the first intermediate conductor layer 31 and/or between the first intermediate conductor layer 31 and the first outer conductor layer 41. In the following description, when it is not necessary to distinguish between the inner-layer conductor layers (50a-50f), the inner-layer conductor layers (50a-50f) are also referred to as "the inner-layer conductor layers 50."

Among the conductor layers included in the wiring substrate 1, the "inner-layer conductor layers" are conductor layers formed anywhere between the first inner conductor layer 21 and the first intermediate conductor layer 31, between the first intermediate conductor layer 31 and the first outer conductor layer 41, between the second inner conductor layer and the second intermediate conductor layer 32, and between the second intermediate conductor layer 32 and the second outer conductor layer 42.

Here, the first intermediate conductor layer 31 is a conductor layer formed between the first inner conductor layer 21 and the first outer conductor layer 41, and has a second laminated structure to be described later. Therefore, in the present embodiment, any conductor layer having the second laminated structure interposed between the first inner conductor layer 21 and the first outer conductor layer 41 can be identified as the first intermediate conductor layer 31. Then, other than the identified first intermediate conductor layer 31, conductor layers formed between the first inner conductor layer 21 and the first outer conductor layer 41 are referred to as "inner-layer conductor layers."

Similarly, any conductor layer having the second laminated structure interposed between the second inner conductor layer 22 and the second outer conductor layer 42 can be identified as the second intermediate conductor layer 32. Then, other than the identified second intermediate conductor layer 32, conductor layers formed between the second inner conductor layer 22 and the second outer conductor layer 42 are referred to as "inner-layer conductor layers."

Therefore, the "intermediate" in the "first intermediate conductor layer 31" and the "second intermediate conductor layer 32" does not necessarily mean a center of a distance between the first or second inner conductor layer (21, 22) and the first or second outer conductor layer (41, 42). That is, the first intermediate conductor layer 31 is provided between the first inner conductor layer 21 and the first outer conductor layer 41, and is not necessarily at a middle position between the first inner conductor layer 21 and the first outer conductor layer 41 in a thickness direction of the wiring substrate 1. Further, the first intermediate conductor layer 31 does not necessarily have to be, for example, a middle layer among the multiple conductor layers provided between the first inner conductor layer 21 and the first outer conductor layer 41. The same also applies to the second intermediate conductor layer 32. Therefore, for example, in the laminated structure illustrated in FIG. 1, it is also possible that the first intermediate conductor layer 31 is provided at the position of the inner-layer conductor layer (50c), or the second intermediate conductor layer 32 is provided at the position of the inner-layer conductor layer (50d).

In the description of the wiring substrate 1, a side farther from the core layer 10 in the thickness direction of the wiring substrate 1 is also referred to as an "upper side" or simply "upper," and a side closer to the core layer 10 is also referred to as a "lower side" or simply "lower." Further, for the conductor layers, conductor patterns included in the conductor layers, and the interlayer insulating layers, a surface facing an opposite side with respect to the core layer 10 is also referred to as an "upper surface," and a surface facing the core layer 10 side is also referred to as a "lower surface." Further, the thickness direction of the wiring substrate 1 is also simply referred to as a "Z direction."

The wiring substrate 1 of FIG. 1 further includes via conductors (10a) provided in the core layer 10 and via conductors 7 provided in the interlayer insulating layers 6. The via conductors (10a) penetrate the core layer 10 and connect the first inner conductor layer 21 and the second inner conductor layer 22 to each other. The via conductors 7 respectively penetrate the interlayer insulating layers 6 that respectively include the via conductors 7, and connect to each other adjacent conductor layers via the interlayer insulating layers 6 (for example, connect to each other the first outer conductor layer 41 and the inner-layer conductor layer (50c)).

The first outer conductor layer 41 and the second outer conductor layer 42 include connection pads (4a) on which electronic components (not illustrated in the drawings) are to be mounted. The wiring substrate 1 in FIG. 1 further includes a solder resist layer 81 formed on the first outer conductor layer 41, and a solder resist layer 82 formed on the second outer conductor layer. The solder resist layers (81, 82) have openings that respectively expose the connection pads (4a). The solder resist layers (81, 82) are each formed using, for example, an epoxy resin, a polyimide resin, or the like.

The core layer 10 and the interlayer insulating layers 6 are each formed using any insulating material. Examples of the insulating material include an epoxy resin, a bismaleimide triazine resin (BT resin), a phenol resin, and the like. The insulating layers formed using these resins may each contain a reinforcing material such as a glass fiber or an aramid fiber, and/or inorganic filler such as silica. In the example of FIG. 1, the core layer 10 contains a reinforcing material (10b). Although not illustrated in the drawings, some or all of the multiple interlayer insulating layers 6 may each contain a reinforcing material.

The via conductors 7 are so-called filled vias formed by filling through holes penetrating the interlayer insulating layers 6 with conductors. Each of the via conductors 7 is integrally formed with a conductor layer on an upper side thereof. For example, the via conductors 7 formed directly below the first outer conductor layer 41 are formed together and integrally with the first outer conductor layer 41. The via conductors 7 are each formed by, for example, an electroless plating film and an electrolytic plating film of copper, nickel, or the like. The via conductors (10a) are also each formed by an electroless plating film and an electrolytic plating film of copper, nickel, or the like. The via conductors (10a) are formed together and integrally with the first inner conductor layer 21.

The via conductors 7 each have a tapered shape that is reduced in diameter toward the core layer 10 in the Z direction. Further, in the example of FIG. 1, each of the via conductors (10a) is reduced in diameter from the first surface (10F) side toward the second surface (10S) side of the core layer 10, and has a bottom (where a cross-sectional area of the via conductor is the smallest) at the second surface (10S) of the core layer 10. Although the term "reduced in diameter" is used for convenience, the via conductors 7 and the via conductors (10a) are not limited to each have a circular or elliptical cross-sectional shape perpendicular to the Z direction.

In the example of FIG. 1, as illustrated on the left side of FIG. 1, the wiring substrate 1 includes stacked via conductors 71. The stacked via conductors 71 are each formed by a stack of via conductors 7 formed at positions overlapping each other in a plan view in the interlayer insulating layers 6. By two stacked via conductors 71 and a via conductor (10a), the first outer conductor layer 41 and the second outer conductor layer 42 are electrically connected to each other through a substantially shortest path and are connected to the other conductor layers.

Figure 2A:
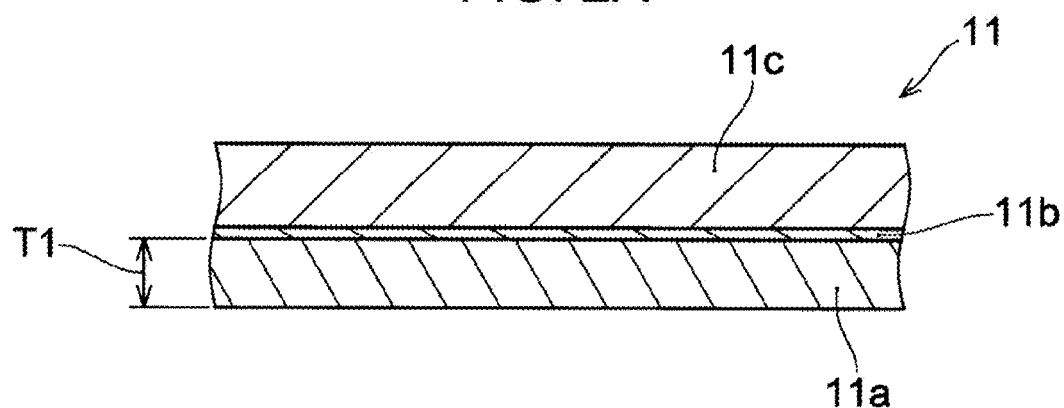
FIG. 2A is an enlarged view of a first laminated structure of a conductor layer illustrated in FIG. 1.
Figure 2B:
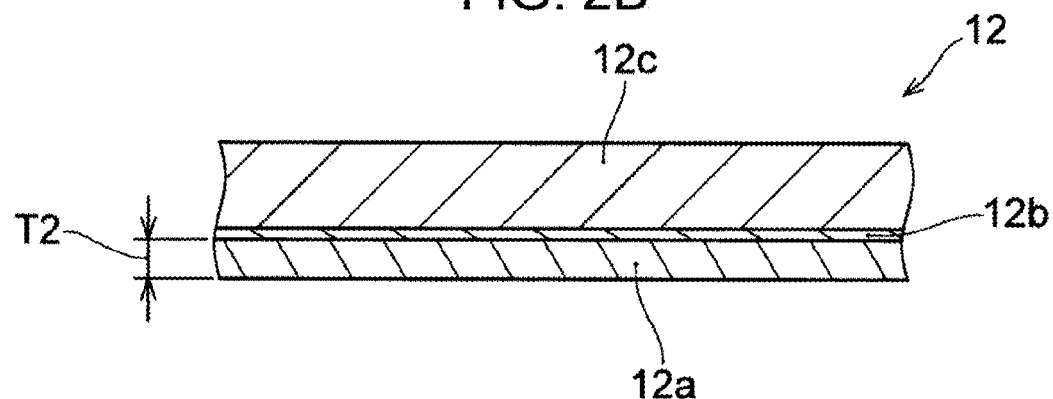
FIG. 2B is an enlarged view of a second laminated structure of a conductor layer illustrated in FIG. 1.

The first and second inner conductor layers (21, 22), the first and second intermediate conductor layers (31, 32), the first and second outer conductor layers (41, 42), and the inner-layer conductor layers (50a-50f) can each be formed, for example, using any metal such as copper, nickel, silver, or palladium alone or using two or more of these metals in combination. However, these conductor layers can have different structures from each other. In the example illustrated in FIG. 1, the first inner conductor layer 21, the first outer conductor layer 41, the second inner conductor layer 22 and the second outer conductor layer 42 have the same layer structure, and each have a three-layer structure including, as illustrated in FIG. 2A, a metal foil layer (11a), an intermediate metal layer (11b) and a plating film layer (11c). The first intermediate conductor layer 31 and the second intermediate conductor layer 32 also each have a three-layer structure including, as illustrated in FIG. 2B, a metal foil layer (12a), an intermediate metal layer (12b) and a plating film layer (12c), but, as will be described in detail later, have structures different from those of the first inner conductor layer 21, the first outer conductor layer 41, the second inner conductor layer 22 and the second outer conductor layer 42.

The via conductors (10a) provided in the wiring substrate 1 of FIG. 1 are each reduced in diameter from the first surface (10F) side to the second surface (10S) side of the core layer 10, and are integrally formed with the first inner conductor layer 21. That is, the via conductors (10a) are bottomed via conductors (similar to the via conductors 7) connecting the first and second inner conductor layers (21, 22) to each other.

In the wiring substrate 1 illustrated in FIG. 1, the second inner conductor layer 22 is formed to have a larger thickness than the first inner conductor layer 21. Specifically, a plating film layer (11c2) of the second inner conductor layer 22 has a larger thickness than a plating film layer (11c1) of the first inner conductor layer 21.

By forming the first inner conductor layer 21 to be thinner than the second inner conductor layer 22, an imbalance in conductor volume between the first surface (10F) side and the second surface (10S) side of the via conductors (10a) that are each reduced in diameter toward the second surface (10S) of the core layer 10 can be reduced. That is, since the via conductors (10a) each have a tapered shape that is reduced in diameter from the first surface (10F) toward the second surface (10S), a difference in conductor content (volume) between a portion on the first surface (10F) side and a portion on the second surface (10S) side from a center in the thickness direction of the core layer 10, and the conductor content of the portion on the first surface (10F) side is larger than the conductor content of the portion on the second surface (10S) side. As a result, when temperature rises, a difference in thermal expansion amount between the first surface (10F) side and the second surface (10S) side occurs, and a force can be generated causing the core substrate (10P) to curve to be convex toward the first surface (10F) side. On the other hand, by forming the second inner conductor layer 22 to be thicker than the first inner conductor layer 21, a force can be generated causing the core substrate (10P) to curve to be convex toward the second surface (10S) side. Therefore, the force caused by the imbalance in conductor content in the via conductors (10a) can be canceled and the warpage of the core substrate (10P) can be suppressed. Depending on a thermal expansion coefficient of the insulating layer of the core layer 10, a force can be generated to curve the core substrate (10P) to be convex toward the second surface (10S). However, in this case, since the second inner conductor layer 22 is formed relatively thick, warpage can be suppressed.

In the example illustrated in FIG. 1, the via conductors (10a) are each reduced in diameter from the first surface (10F) side toward the second surface (10S) side and each have a bottom positioned at the second surface (10S). However, it is also possible that the via conductors (10a)

each have a shape that is reduced in diameter from the second surface (10S) toward the first surface (10F). In this case, the via conductors (10a) each have a bottom positioned at the first surface (10F), and the via conductors (10a) are integrally formed with the plating film layer (11c2) of the second inner conductor layer 22, and the plating film layer (11c2) is formed to be thinner than the plating film layer (11c1) of the first inner conductor layer 21.

Next, with reference to FIGS. 2A and 2B, laminated structures of the conductor layers are described. FIG. 2A illustrates an example of a first laminated structure 11 included in each of the first inner conductor layer 21, the second inner conductor layer 22, the first outer conductor layer 41 and the second outer conductor layer 42. As illustrated in FIG. 2A, the first laminated structure 11 includes at least a metal foil layer (11a) having a predetermined thickness (T1), and plating film layer (11c). The first laminated structure 11 of FIG. 2A further includes an intermediate metal layer (11b) between the metal foil layer (11a) and the plating film layer (11c). The conductor layers having the first laminated structure 11 are patterned using, for example, a subtractive method.

The metal foil layer (11a) is, for example, formed of a metal foil containing copper, nickel, or the like as a main material. The plating film layer (11c) is, for example, a plating film formed by electrolytic plating, and a material thereof is, for example, copper, nickel, or the like. The intermediate metal layer (11b) is used as a seed layer that can also function as an electrode when the plating film layer (11c) is formed by electrolytic plating. A material of the intermediate metal layer (11b) is, for example, copper, nickel, or the like. The intermediate metal layer (11b) is formed, for example, by electroless plating, sputtering, or the like. In the conductor layers having the first laminated structure 11, the metal foil layer (11a) faces toward a lower side (the core layer 10 side).

FIG. 2B illustrates an example of a second laminated structure 12 of the first intermediate conductor layer 31 and the second intermediate conductor layer 32. As illustrated in FIG. 2B, the second laminated structure 12 includes at least a metal foil layer (12a) and a plating film layer (12c), the metal foil layer (12a) having a thickness (T2) which is smaller than the predetermined thickness (T1) of the metal foil layer (11a) of the above-described first laminated structure 11. The second laminated structure 12 of FIG. 2B further includes an intermediate metal layer (12b) between the metal foil layer (12a) and the plating film layer (12c). As compared to a conductor layer having the first laminated structure 11, a conductor pattern can be formed at a fine pitch in a conductor layer having the second laminated structure 12 that includes the metal foil layer (12a) thinner than the metal foil layer (11a) of FIG. 2A. A conductor pattern having the second laminated structure 12 can be formed, for example, using a semi-additive method using a metal foil (so-called MSAP method: Modified Semi Additive Process).

Similar to the metal foil layer (11a) of the first laminated structure 11, the metal foil layer (12a) is formed of a metal foil containing copper, nickel, or the like as a main material. Similar to the intermediate metal layer (11b) of the first laminated structure 11, the intermediate metal layer (12b) is formed, for example, by electroless plating or sputtering using copper, nickel, or the like, and can function as a seed layer in forming the plating film layer (12c). Then, the plating film layer (12c) is preferably formed by electrolytic plating using, for example, copper, nickel, or the like. In the conductor layers having the second laminated structure 12, the metal foil layer (12a) faces toward a lower side (the core layer 10 side).

The thickness (T1) of the metal foil layer (11a) of the first laminated structure 11 is, for example, about 5 μm or more and 30 μm or less. However, the thickness (T1) is not limited to this example. The thickness (T2) of the metal foil layer (12a) of the second laminated structure 12 is, for example, about 0.5 μm or more and 5 μm or less. However, the thickness (T2) is not limited to this example.

A thickness of each of the first and second inner conductor layers (21, 22), the first and second intermediate conductor layers (31, 32), and the first and second outer conductor layers (41, 42) is, but not limited to, for example, about 10 μm or more and 40 μm or less. The thickness (T1) of the metal foil layer (11a) included in each of the first and second outer conductor layers (41, 42) and the like is larger than the thickness (T2) of the metal foil layer (12a) included in each of the intermediate conductor layers (31, 32). Therefore, from a point of view of ensuring a desired thickness for each of the conductor layers, the plating film layer (11c) included in the first laminated structure 11 may have a smaller thickness than the plating film layer (12c) included in the second laminated structure 12.

The inner-layer conductor layers (50a-50f) may each have either the first laminated structure 11 illustrated in FIG. 2A or the second laminated structure 12 illustrated in FIG. 2B. In the example of FIG. 1, the inner-layer conductor layers (50a, 50b, 50d, 50e) have the second laminated structure 12, and the inner-layer conductor layers (50c, 50f) have the first laminated structure 11.

Figure 3A:
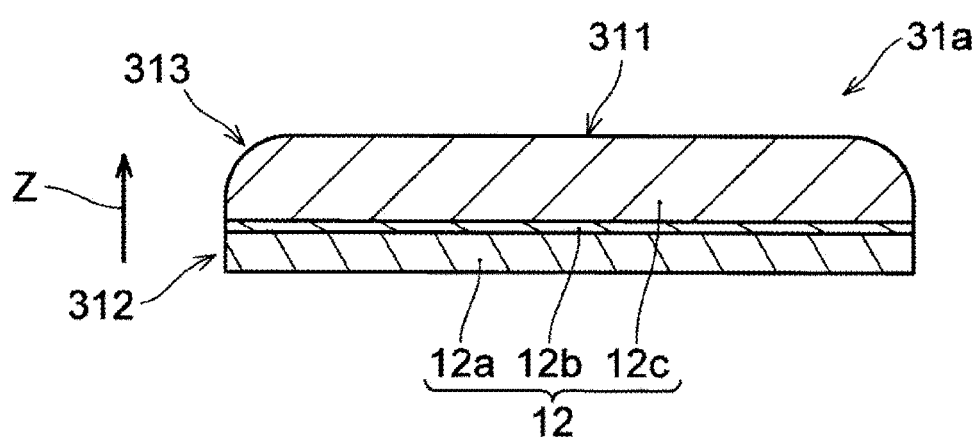
FIG. 3A is a cross-sectional view illustrating an example of a conductor pattern having the second laminated structure of the embodiment.
Figure 3B:
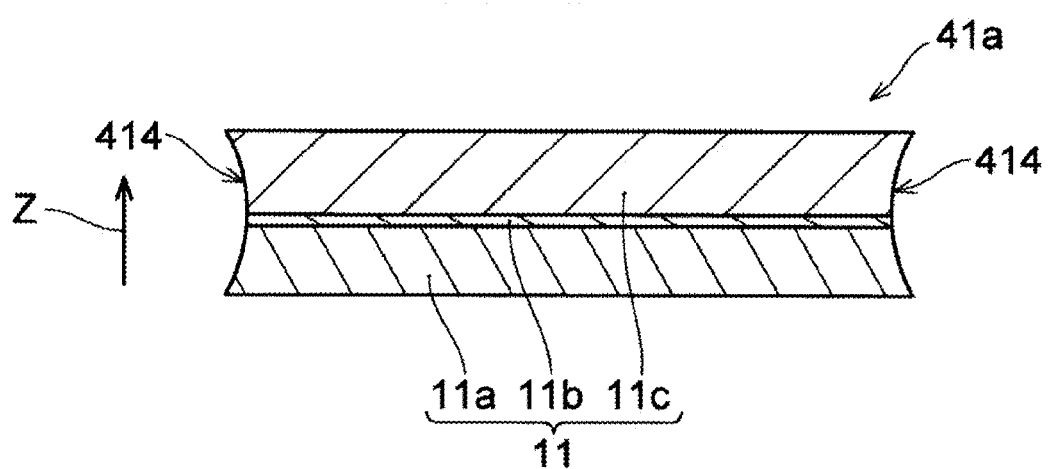
FIG. 3B is a cross-sectional view illustrating an example of a conductor pattern having the first laminated structure of the embodiment.

With reference to FIGS. 3A and 3B, some examples of cross-sectional shapes of conductor patterns formed in a conductor layer (such as the first outer conductor layer 41) having the first laminated structure 11 or a conductor layer (such as first intermediate conductor layer 31) having the second laminated structure 12 are described below. In the following description, these conductor patterns are also simply referred as a "conductor pattern having the first laminated structure" or a "conductor pattern having the second laminated structure."

FIG. 3A illustrates an example of a cross section obtained by cutting a conductor pattern (31a) having the second laminated structure 12 along a cutting line along the Z direction (thickness direction of the wiring substrate 1). As illustrated in FIG. 3A, the conductor pattern (31a) includes an inclined portion 313 near a corner portion where an upper surface 311 (surface facing an opposite side with respect to the core layer) and a side surface 312 intersect, that is, near an edge portion of the upper surface 311.

In the inclined portion 313, the upper surface 311 is inclined to become closer to the metal foil layer (12a) side, that is, the core layer 10 side of the wiring substrate 1 with decreasing distance to the side surface 312. In the example illustrated in FIG. 3A, the conductor pattern (31a) is rounded in the inclined portion 313, and, as a result, has a corner radius. Since the conductor pattern (31a) does not have sharp corners, it is thought that a short circuit failure is unlikely to occur between the conductor pattern (31a) and any adjacent conductor pattern in the Z direction or in a direction orthogonal to the Z direction. In the cross section illustrated in FIG. 3A, instead of an R-chamfered inclined portion 313 as in the example of FIG. 3A, the conductor pattern (31a) may have a C-chamfered inclined portion 313.

FIG. 3B illustrates an example of a cross section obtained by cutting a conductor pattern (41a) having the first laminated structure 1 along a cutting line along the Z direction.

In the example of FIG. 3B, side surfaces 414 on both sides of the conductor pattern (41a) curve toward an inner side of the conductor pattern (41a). That is, the conductor pattern (41a) has concave surfaces as the side surfaces 414.

The conductor pattern (41a) of FIG. 3B has a larger contact area with an interlayer insulating layer 6 as compared with a case where the side surfaces 414 are flat. Therefore, it is thought that adhesion strength between an interlayer insulating layer 6 and the conductor pattern (41a) is high, and thus, interfacial peeling is unlikely to occur.

Figure 4:
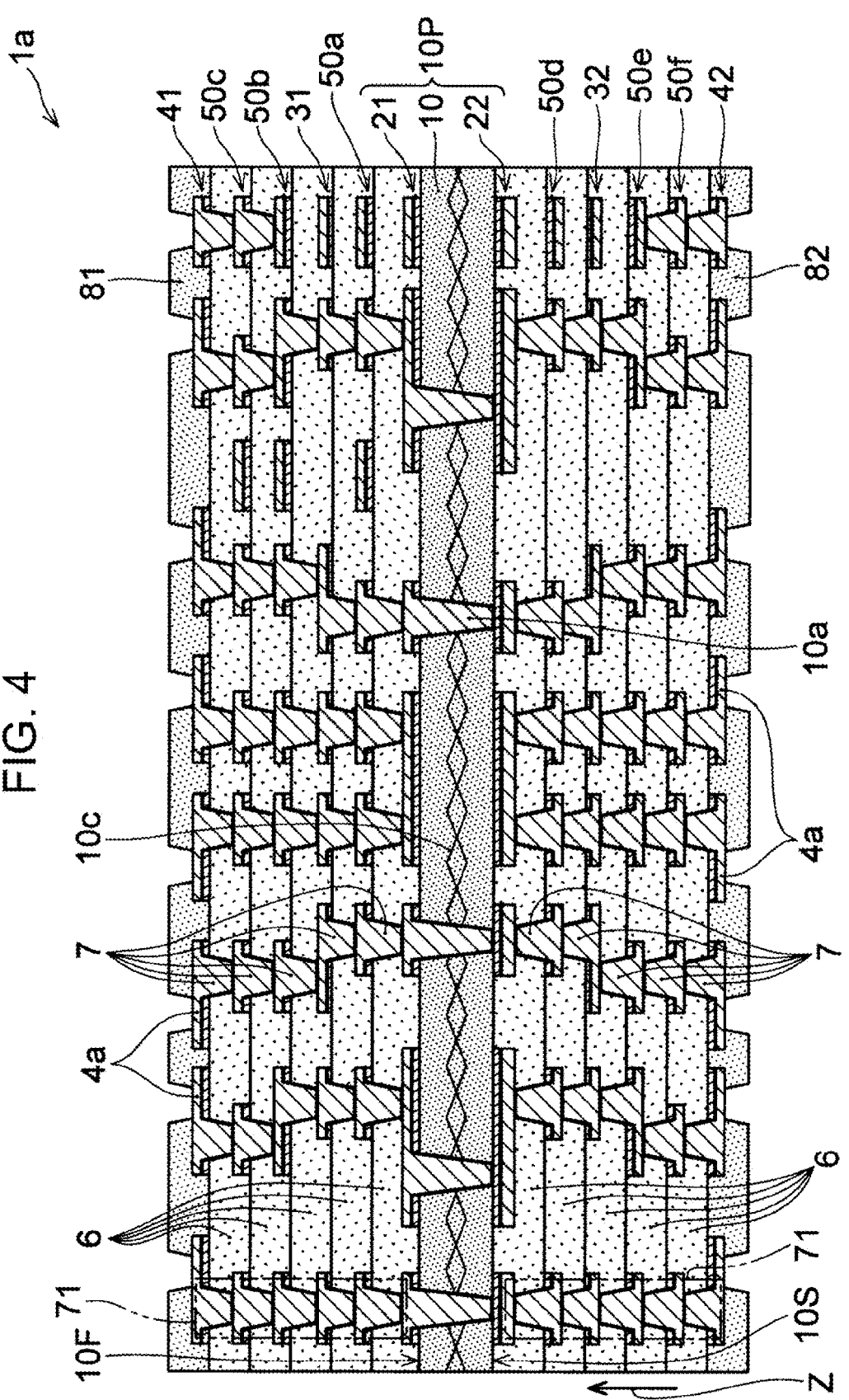
FIG. 4 is a cross-sectional view illustrating another example of a wiring substrate of the embodiment of the present invention.
Figure 5:
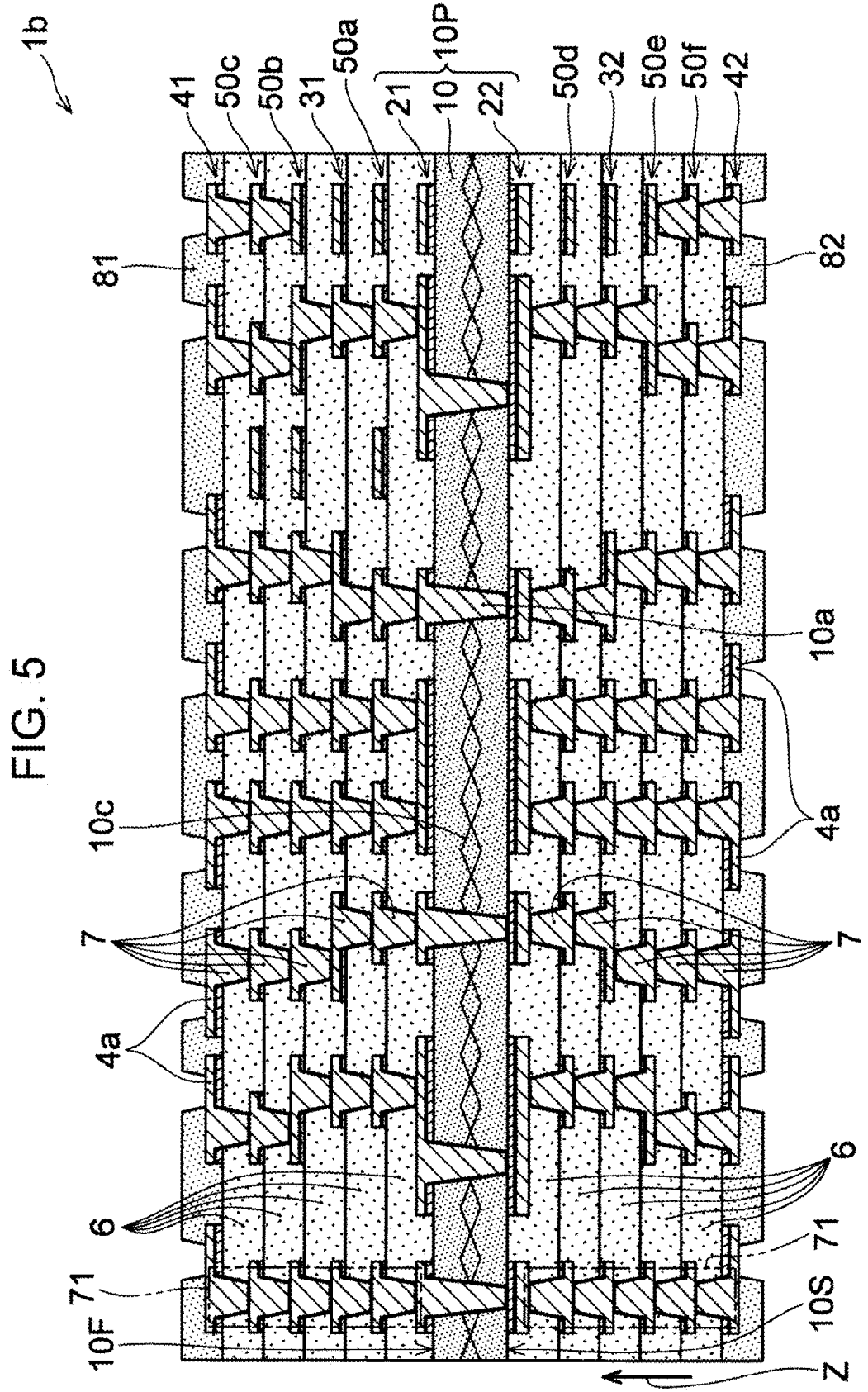
FIG. 5 is a cross-sectional view illustrating yet another example of a wiring substrate of the embodiment of the present invention.

Further, in the wiring substrate of the embodiment, unlike the wiring substrate 1 of the example of FIG. 1, all the inner-layer conductor layers may have the same structure as each other. That is, all the conductor layers formed between the first inner conductor layer 21 and the first outer conductor layer 41 except for the first intermediate conductor layer 31, and, all the conductor layers formed between the second inner conductor layer 22 and the second outer conductor layer 42 except for the second intermediate conductor layer 32, may have the same structure as each other. FIGS. 4 and 5 illustrate other examples (wiring substrates (1a, 1b)) of the wiring substrate of the embodiment including such inner-layer conductor layers (50a-50f).

In the wiring substrate (1a) illustrated in FIG. 4, all the inner-layer conductor layers (50a-50f), including the inner-layer conductor layers (50a, 50b, 50d, 50e) (which have the second laminated structure in the wiring substrate 1 of FIG. 1), have the same first laminated structure as the first and second outer conductor layers (41, 42).

In the wiring substrate (1b) illustrated in FIG. 5, all the inner-layer conductor layers (50a-50f), including the inner-layer conductor layers (50c, 50f) (which have the first laminated structure in the wiring substrate 1 of FIG. 1), have the same second laminated structure as the first and second intermediate conductor layers (31, 32). Therefore, in the wiring substrate (1b) of FIG. 5, all the conductor layers formed between the first inner conductor layer 21 and the first outer conductor layer 41 and between the second inner conductor layer 22 and the second outer conductor layer 42 have the second laminated structure. Configuration elements other than the inner-layer conductor layers (50a-50f) in the wiring substrates (1a, 1b) illustrated in FIGS. 4 and 5 are the same as in the wiring substrate 1 of FIG. 1. Therefore, the configuration elements that are the same as in the wiring substrate 1 of FIG. 1 are denoted using the same reference numeral symbols as in FIG. 1, and repeated description is omitted.

An example of a method for manufacturing the wiring substrate 1 illustrated in FIG. 1 is described below with reference to FIGS. 6A-6C.

Figure 6A:
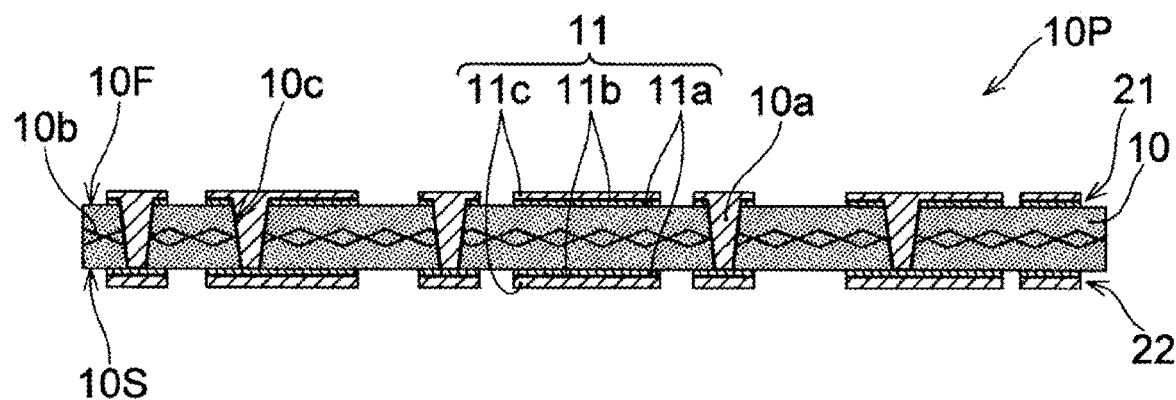
FIG. 6A is a cross-sectional view illustrating an example of a manufacturing process of the wiring substrate of the embodiment.

As illustrated in FIG. 6A, the core substrate (10P) is formed. For example, a laminated plate (for example, a double-sided copper-clad laminated plate) having the core layer 10 and metal foils respectively provided on both sides of the core layer 10 is prepared, the core layer 10 being formed of an insulating resin such as an epoxy resin and containing the reinforcing material (10b). Then, for example, using a subtractive method, the first inner conductor layer 21, the second inner conductor layer 22, and the via conductors (10a) are formed, and the first and second inner conductor layers (21, 22) are patterned to have desired conductor patterns. When holes (10c) for connecting the first inner conductor layer 21 and the second inner conductor layer 22 to each other are provided in the core layer 10 by laser processing, a treatment for reducing laser reflection is performed by subjecting a surface of a metal foil (the metal foil (11a) of the first inner conductor layer 21) at sites where laser processing is to be performed to a blackening treatment. Since laser processing energy is reduced by the blackening treatment, the holes (10c) are formed while damage to a metal foil on an opposite side (the metal foil (11a) of the second inner conductor layer 22) is suppressed. When laser is irradiated to only one side of the core layer 10, for example, the first surface (10F) side, as illustrated in FIGS. 1 and 6A, the via conductors (10a) are formed each having a tapered shape that is reduced in diameter from the first surface (10F) toward the second surface (10S).

The first and second inner conductor layers (21, 22) are each formed to have the first laminated structure 11. That is, the metal foils that are respectively provided on the both sides of the core layer 10 each form a metal foil layer (11a), and a seed layer formed by electroless plating for forming the via conductors (10a) forms an intermediate metal layer (11b). Then, an electrolytic plating film formed on the seed layer forms a plating film layer (11c). The electrolytic plating film layer (11c) on the side where the via conductors (10a) each have a large diameter (the first surface (10F) side of the core layer 10 in the example illustrated in FIG. 6A) is formed to be thinner than the plating film layer (11c) on an opposite side (the second surface (10S) side of the core layer 10 in the example of FIG. 6A) where the via conductors (10a) each have a small diameter. A degree of the difference in thickness between the electrolytic plating film layer (11c) of the first inner conductor layer 21 and the electrolytic plating film layer (11c) of the second inner conductor layer 22 can be adjusted by electrolytic plating conditions (such as a copper sulfate concentration, an accelerator concentration, an inhibitor concentration, a plating time period, and/or a temperature). Further, it is also possible that the electrolytic plating film layer (11c) of the first inner conductor layer 21 and the electrolytic plating film layer (11c) of the second inner conductor layer 22 are formed to have the same thickness, and then, by polishing the surface of the plating film layer (11c) of the first inner conductor layer 21, the plating film layer (11c) of the first inner conductor layer 21 is adjusted to be thinner than the plating film layer (11c) of the second inner conductor layer 22. When the first and second inner conductor layers (21, 22) are formed using a subtractive method, a surface of the plating film layer (11c) is covered with an etching mask when the first and second inner conductor layers (21, 22) are patterned.

Figure 6B:
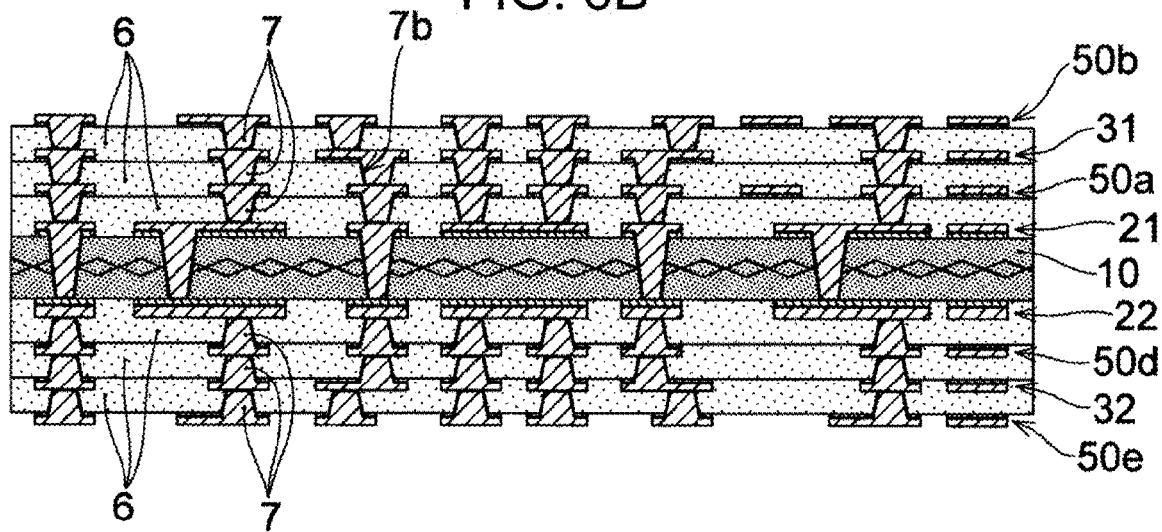
FIG. 6B is a cross-sectional view illustrating an example of a manufacturing process of the wiring substrate of the embodiment.

As illustrated in FIG. 6B, the interlayer insulating layers 6 and the conductor layers are alternately formed on both sides of the core layer 10 and the via conductors 7 are formed in the interlayer insulating layers 6. FIG. 6B illustrates an example of a state in which the formation of the inner-layer conductor layer (50b) and the inner-layer conductor layer (50e) has been completed. An example of a method for forming the inner-layer conductor layers (50a, 50b, 50d, 50e) is a semi-additive method using a metal foil.

The first and second intermediate conductor layers (31, 32) are formed to have the second laminated structure. In manufacturing the wiring substrate 1 in the example of FIG. 1, the inner-layer conductor layers (50a, 50d) are also formed to have the second laminated structure. An example of a method for forming the conductor layers having the second laminated structure is a semi-additive method using a metal foil. That is, for example, on each of the already formed inner-layer conductor layers (50a, 50d), a sheet-like prepreg and a metal foil (which will become the metal foil layer of the second laminated structure) are sequentially laminated and thermocompression-bonded, and an interlayer insulating layer 6 is formed. For this metal foil, a metal foil thinner than the metal foil used in forming the first and second inner conductor layers (21, 22) having the first laminated structure is used.

By irradiating $CO_2$ laser or the like, holes (7b) for forming the via conductors 7 are formed penetrating the metal foil and the interlayer insulating layer 6. A seed layer (which will become the intermediate metal layer of the second laminated structure) is formed on inner walls of the holes (7b) and on the metal foil by electrolytic plating, sputtering, or the like. Then, on the seed layer, a plating resist (not illustrated in the drawings) having openings at appropriate positions is provided, and, by electrolytic plating using the seed layer as an electrode, conductor patterns of the first and second intermediate conductor layers (31, 32) and via conductors 7 are respectively formed in the openings of the plating resist and in the holes (7b). The plating film formed by electrolytic plating forms the plating film layer (12c) of the second laminated structure. The plating resist (not illustrated in the drawings) is removed, and unwanted portions of the metal foil and the seed layer are removed by etching or the like. The surface of the plating film layer (12c) of the second laminated structure can be etched by being exposed to an etching solution when unwanted portions of the seed layer and the like are removed. That is, surface roughness of the plating film layer (12c) can be reduced.

Figure 6C:
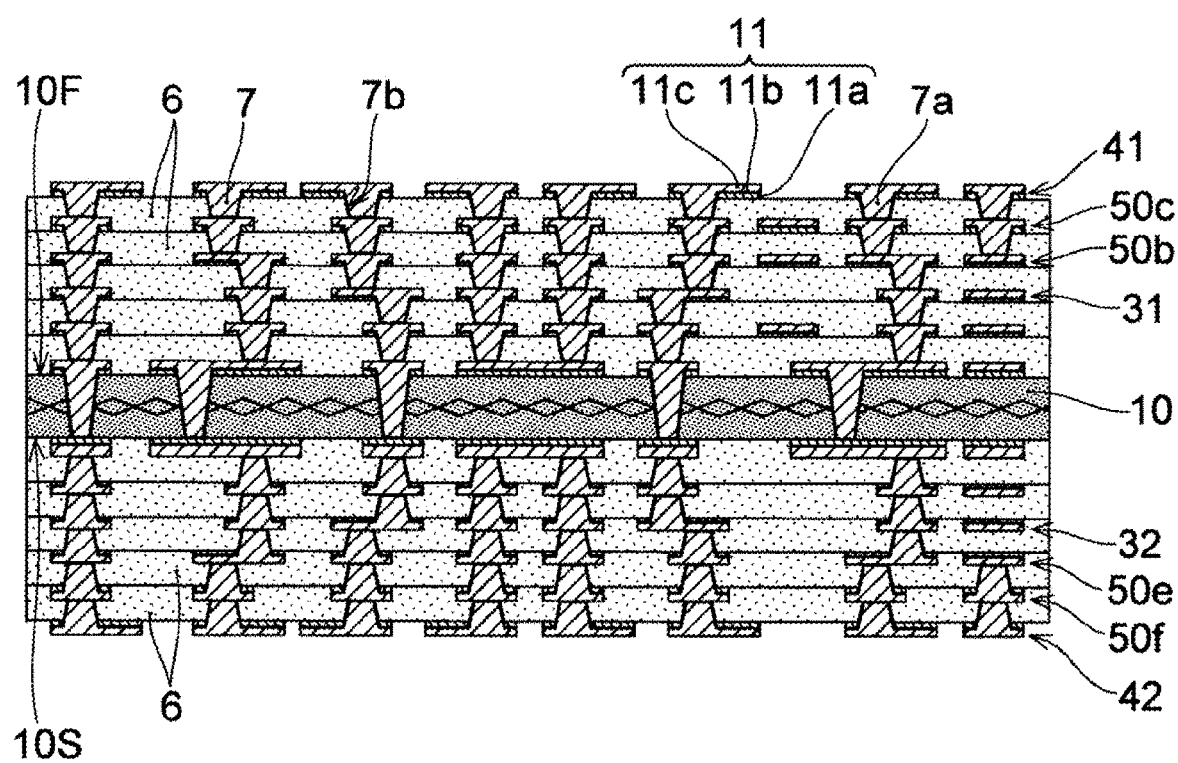
FIG. 6C is a cross-sectional view illustrating an example of a manufacturing process of the wiring substrate of the embodiment.

Further, as illustrated in FIG. 6C, on the first surface (10F) side of the core layer 10, the inner-layer conductor layer (50c) and the first outer conductor layer 41, and the interlayer insulating layers 6 are formed, and, on the second surface (10S) side, the inner-layer conductor layer (50f) and the second outer conductor layer 42, and the interlayer insulating layers 6 are formed. As described above with reference to FIG. 6B, the interlayer insulating layers 6 are each formed, for example, by thermocompression-bonding of a sheet-like prepreg or the like. A method of forming the inner-layer conductor layers (50c, 50f) is not particularly limited. In the example of FIG. 6C, the inner-layer conductor layers (50c, 50f) are formed using a subtractive method using a metal foil.

The first and second outer conductor layers (41, 42) are each formed to have the first laminated structure 11. An example of a method for forming the first and second outer conductor layers (41, 42) is a subtractive method using a metal foil. That is, on each of the already formed inner-layer conductor layers (50c, 50f), a metal foil (which will become the metal foil layer (11a) of the first laminated structure 11) is laminated together with a resin sheet (prepreg) (which will become an interlayer insulating layer 6). For this metal foil, a metal foil thicker than the metal foil used in forming the first and second intermediate conductor layers (31, 32) having the second laminated structure is used.

Holes (7b) for forming the via conductors 7 are formed in the metal foil layer (11a) and the interlayer insulating layer 6 below the metal foil layer (11a) by, for example, $CO_2$ laser irradiation. Subsequently, a seed layer (which will become the intermediate metal layer (11b) of the first laminated structure 11) is formed by electroless plating or the like in the holes (7b) and on the entire surface of the metal foil layer (11a). Further, by electroplating using the seed layer as an electrode, a plating film (which will become the plating film layer (11c) of the first laminated structure 11) is formed on the entire surface of the seed layer. As a result, the first and second outer conductor layers (41, 42) having the first laminated structure 11 are formed, and the via conductors 7 are formed in the holes (7b). Thereafter, the first and second outer conductor layers (41, 42) are patterned using a subtractive method.

Thereafter, the solder resist layer 81 is formed on the first outer conductor layer 41, and the solder resist layer 82 is formed on the second outer conductor layer 42. The solder resist layers (81, 82) are each formed by, for example, forming a resin layer containing a photosensitive epoxy resin or polyimide resin or the like, and performing exposure and development using a mask having an appropriate pattern. Through the above processes, the wiring substrate 1 in the example of FIG. 1 is completed. When necessary, a surface protective film (not illustrated in the drawings) formed of Au, Ni/Au, Ni/Pd/Au, solder, heat resistant preflux, or the like may be formed by electroless plating, solder leveling, spray coating, or the like on the connection pads (4a) exposed from the openings of the solder resist layers (81, 82).

When a conductor layer having the second laminated structure is formed using a semi-additive method, a corner portion between an upper surface and a side surface of a conductor pattern formed in the conductor layer can be chamfered. For example, when unwanted portions of the above-described seed layer and the like are removed, an already formed conductor pattern can be exposed to an etching solution. Therefore, corner portions of the conductor pattern can be removed by an amount corresponding to an etching condition. As a result, it is possible that a conductor pattern having the shape illustrated in the above-referred FIG. 3A can be formed.

A method for forming a conductor layer having the first laminated structure 11 is not limited to a subtractive method as long as the conductor layer includes a metal foil layer and a plating film layer. Further, a method for forming a conductor layer having the second laminated structure 12 is not limited as long as the conductor layer includes a metal foil layer and a plating film layer, the metal foil layer being thinner than the metal foil layer included in the first laminated structure 11.

The wiring substrates of the embodiment are not limited to those having the structures illustrated in the drawings and those having the structures, shapes, and materials exemplified herein. For example, it is not always necessary to provide the stacked via conductors 71. Further, it is also possible that the via conductors 7 do not each have a shape that is reduced in diameter toward the core layer 10 side. Further, it is not always necessary to provide the solder resist layers (81, 82).

In the multilayer printed wiring board of International Publication No. 2008/053833, the via holes of the double-sided copper-clad laminated plate are formed by laser processing from one side of the double-sided copper-clad laminated plate and are formed into tapered truncated cone shapes that are reduced in diameter toward the other side. The diameter of each of the via holes differs on one side and the other side of the double-sided copper-clad laminated plate. Therefore, a conductor material content differs on one side and the other side in each of the via holes of the double-sided copper-clad laminated plate, and it is thought that there is a risk that warpage of a core substrate due to this difference may occur.

A wiring substrate according to an embodiment of the present invention includes: a core layer having a first surface and a second surface on an opposite side with respect to the first surface; a first inner conductor layer formed on the first surface; a second inner conductor layer formed on the second surface; a first outer conductor layer formed on an outermost layer on the first surface side; a second outer conductor layer formed on an outermost layer on the second surface side; a first intermediate conductor layer formed between the first inner conductor layer and the first outer conductor layer; a second intermediate conductor layer formed between the second inner conductor layer and the second outer conductor layer; and interlayer insulating layers respectively interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer. The first inner conductor layer, the second inner conductor layer, the first outer conductor layer and the second outer conductor layer each have a first laminated structure that includes at least a metal foil layer and a plating film layer, the metal foil layer having a predetermined thickness. The first intermediate conductor layer and the second intermediate conductor layer each have a second laminated structure that includes at least a metal foil layer and a plating film layer, the metal foil layer having a thickness smaller than the predetermined thickness. Via conductors that are each reduced in diameter from a one-side conductor layer (which is one of the first inner conductor layer and the second inner conductor layer) toward an other-side conductor layer (which is the other one of the first inner conductor layer and the second inner conductor layer) and connect the first inner conductor layer and the second inner conductor layer to each other are formed in the core layer. The other-side conductor layer is formed to be thicker than the one-side conductor layer.

According to an embodiment of the present invention, it is thought that warpage in a multilayer substrate can be suppressed, and this can contribute to improving quality of the wiring substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
    a core layer;
    a plurality of first conductor layers formed on a first surface of the core layer and comprising a first inner conductor layer formed on the first surface of the core layer, a first outer conductor layer forming an outermost conductor layer on a first surface side of the core layer, and a first intermediate conductor layer formed between the first inner conductor layer and the first outer conductor layer;
    a plurality of second conductor layers formed on a second surface of the core layer on an opposite side with respect to the first surface of the core layer and comprising a second inner conductor layer formed on the second surface of the core layer, a second outer conductor layer forming an outermost conductor layer on a second surface side of the core layer, and a second intermediate conductor layer formed between the second inner conductor layer and the second outer conductor layer;
    a plurality of interlayer insulating layers interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer; and
    a plurality of via conductors formed in the core layer such that each of the via conductors decreases in diameter from the first inner conductor layer toward the second inner conductor layer and connects the first inner conductor layer and the second inner conductor layer, and that the second inner conductor layer is formed to have a thickness that is greater than a thickness of the first inner conductor layer,
    wherein each of the first and second inner conductor layers comprises a first laminated structure including a metal foil layer and a plating film layer, at least one of the first and second outer conductor layers comprises the first laminated structure, at least one of the first and second intermediate conductor layers comprises a second laminated structure including a metal foil layer and a plating film layer, the first inner conductor layer and the second inner conductor layer are formed such that the plating film layer of the second inner conductor layer is formed to have a thickness that is greater than a thickness of the plating film layer of the first inner conductor layer, and the first inner conductor layer and the second inner conductor layer are formed such that the metal foil layer of the second inner conductor layer is formed to have a thickness that is substantially equal to a thickness of the metal foil layer of the first inner conductor layer.

2. The wiring substrate according to claim 1, wherein the metal foil layer of the second laminated structure has a thickness that is smaller than a thickness of the metal foil layer of the first laminated structure.

3. The wiring substrate according to claim 1, wherein the first inner conductor layer and the second inner conductor layer are formed such that each of the first and second inner conductor layers includes a plurality of conductor patterns comprising a plurality of pad portions and a plurality of non-pad portions.

4. The wiring substrate according to claim 2, wherein the plurality of first conductor layers includes an inner-layer conductor layer formed between the first inner conductor layer and the first intermediate conductor layer such that the inner-layer conductor layer has one of the first laminated structure and the second laminated structure.

5. The wiring substrate according to claim 2, wherein the plurality of first conductor layers includes an inner-layer conductor layer formed between the first intermediate conductor layer and the first outer conductor layer such that the inner-layer conductor layer has one of the first laminated structure and the second laminated structure.

6. The wiring substrate according to claim 2, wherein the plurality of first conductor layers includes a first inner-layer conductor layer formed between the first inner conductor layer and the first intermediate conductor layer, the plurality of second conductor layers includes a second inner-layer conductor layer formed between the second inner conductor layer and the second intermediate conductor layer, and the first and second inner-layer conductor layers have one of the first laminated structure and the second laminated structure.

7. The wiring substrate according to claim 1, wherein each of the first and second intermediate conductor layers has the second laminated structure formed such that the metal foil layer of the second laminated structure has a thickness that is smaller than a thickness of the metal foil layer of the first laminated structure.

8. The wiring substrate according to claim 1, wherein the plurality of first conductor layers includes an inner-layer conductor layer formed between the first inner conductor layer and the first intermediate conductor layer such that the inner-layer conductor layer has one of the first laminated structure and the second laminated structure.

9. The wiring substrate according to claim 8, wherein the inner-layer conductor layer has the first laminated structure.

10. The wiring substrate according to claim 8, wherein the inner-layer conductor layer has the second laminated structure.

11. The wiring substrate according to claim 1, wherein the plurality of first conductor layers includes an inner-layer conductor layer formed between the first intermediate conductor layer and the first outer conductor layer such that the inner-layer conductor layer has one of the first laminated structure and the second laminated structure.

12. The wiring substrate according to claim 11, wherein the inner-layer conductor layer has the first laminated structure.

13. The wiring substrate according to claim 11, wherein the inner-layer conductor layer has the second laminated structure.

14. The wiring substrate according to claim 1, wherein the plurality of first conductor layers includes a first inner-layer conductor layer formed between the first inner conductor layer and the first intermediate conductor layer, the plurality of second conductor layers includes a second inner-layer conductor layer formed between the second inner conductor layer and the second intermediate conductor layer, and the first and second inner-layer conductor layers have one of the first laminated structure and the second laminated structure.

15. The wiring substrate according to claim 14, wherein the first and second inner-layer conductor layers have the first laminated structure.

16. The wiring substrate according to claim 14, wherein the first and second inner-layer conductor layers have the second laminated structure.

17. The wiring substrate according to claim 1, wherein the plurality of first conductor layers includes a plurality of first inner-layer conductor layers formed between the first inner conductor layer and the first intermediate conductor layer and between the first intermediate conductor layer and the first outer conductor layer respectively, the plurality of second conductor layers includes a plurality of second inner-layer conductor layers formed between the second inner conductor layer and the second intermediate conductor layer and between the second intermediate conductor layer and the second outer conductor layer respectively, and the first and second inner-layer conductor layers have one of the first laminated structure and the second laminated structure.

18. The wiring substrate according to claim 17, wherein the first and second inner-layer conductor layers have the first laminated structure.

19. The wiring substrate according to claim 17, wherein the first and second inner-layer conductor layers have the second laminated structure.

20. The wiring substrate according to claim 2, wherein the first inner conductor layer and the second inner conductor layer are formed such that each of the first and second inner conductor layers includes a plurality of conductor patterns comprising a plurality of pad portions and a plurality of non-pad portions.

\* \* \* \* \*